United States Patent
Rouchard

[19]

[11] Patent Number: 5,811,977
[45] Date of Patent: Sep. 22, 1998

[54] DEVICE FOR ELECTRICALLY TESTING AN ELECTRICAL CONNECTION MEMBER

[75] Inventor: Gilles Rouchard, Montmirail, France

[73] Assignee: Axon'Cable, S.A., Montmirail, France

[21] Appl. No.: 640,766

[22] PCT Filed: Nov. 18, 1994

[86] PCT No.: PCT/FR94/01349

§ 371 Date: May 6, 1996

§ 102(e) Date: May 6, 1996

[87] PCT Pub. No.: WO95/14237

PCT Pub. Date: May 26, 1995

[30] Foreign Application Priority Data

Nov. 18, 1993 [FR] France .................................. 93 13775

[51] Int. Cl.⁶ .................................................. G01R 31/04
[52] U.S. Cl. ........................................... 324/538; 324/126
[58] Field of Search ..................... 324/415, 500, 324/537, 538, 555, 126

[56] References Cited

U.S. PATENT DOCUMENTS

| | | | |
|---|---|---|---|
| 5,097,213 | 3/1992 | Hunting et al. ........................ | 324/538 |
| 5,444,390 | 8/1995 | Barlett et al. ........................ | 324/537 X |
| 5,532,581 | 7/1996 | Ohkura et al. ........................ | 324/126 X |

FOREIGN PATENT DOCUMENTS

| | | | |
|---|---|---|---|
| 0 103 971 | 3/1984 | European Pat. Off. ........ | G01R 31/02 |
| 86 12144 | 2/1988 | France ............................ | G01R 31/02 |

OTHER PUBLICATIONS

European Search Report from European patent application PCT/FR94/01349, filed Nov. 18, 1994.

*Primary Examiner*—Glenn W. Brown
*Attorney, Agent, or Firm*—Wolf, Greenfield & Sacks, P.C.

[57] ABSTRACT

The invention relates to apparatus for electrically testing an electrical connection harness (10). The apparatus comprises an electrical signal generator (24) and a measuring device (22) which are connected by two switches (26, 28) to branch lines (16) of the harness via "subscriber" cards (30) which simulate the states of the components that are to be connected to the branch lines. A control unit (32, 38) enables the switches (26, 28) and the "subscriber" cards (30) to be controlled to simulate different configurations of the components (sending, receiving, normal load, short circuit, open circuit).

3 Claims, 3 Drawing Sheets

DEVICE FOR ELECTRICALLY TESTING AN ELECTRICAL CONNECTION MEMBER

The present invention relates to apparatus for electrically testing an electrical connection member constituted by a main line and by $n$ branch lines connected to the main line via couplers.

More precisely, the invention relates to apparatus enabling electrical tests to be applied to determine and verify electrical transmission properties between various electrical components connected to a main line by branch lines, themselves connected to the main line by couplers. A certain number of electrical installations are to be found having various electronic or electrical components, in particular as constituted by sensors or actuators, that interchange data via a single main line, with this type of connection usually being called a "bus" or a "harness/bus". This disposition is to be found, in particular, in electrical circuits of the kind installed, for example, in space rockets for interconnecting the various sensors or actuators of the rocket. Given the cost of such a rocket and of launching it, it is clearly of great importance for the electrical connection members between its various components to be capable of being fully tested prior to being installed in the rocket or in any similar installation in order to avoid risks of breakdown or faulty operation.

In the special case of space installations, this type of "harness/bus" interconnection must satisfy the standard: MIL-STD-1553B. However, for other types of installation, it is necessary to verify that interconnections comply with standards of the same type.

In general, the various interconnection systems must be tested in different configurations, i.e., in succession, when each of the components connected by branch lines behaves as a sender, when it behaves as a receiver, when an input load is applied thereto to simulate a card, i.e. an electronic circuit, and possibly when one of the receivers or senders referred to below as a "subscriber" is short circuit or open circuit to simulate damage to the installation as a whole in order to test its behavior in such a configuration.

It will easily be understood that when the harness/bus is used to interconnect a large number of components, e.g. about ten, the number of different configurations to be tested in order to be sure that each branch line is properly coupled to the main line is extremely high.

With the means used at present, which are means that are essentially manual and not automatic, the time that would be required for testing all configurations properly becomes prohibitive. Consequently, only a limited number of critical configurations are actually tested. It will be understood, that although such a test procedure is statistically capable of detecting breakdowns or damage of the kind that is the most frequent, it is incapable of ensuring that the interconnection installation will operate properly in all of its possible configurations.

As already briefly outlined, when this system of interconnections and the quality of its operation are critical points for the operation of a rocket or similar equipment where cost is very high, it is advantageous to ascertain in as complete a manner as possible that all of the electrical lines are operating properly before mounting the system in the rocket.

To remedy the technical drawbacks of the prior art, the invention seeks to provide a device for electrically testing an electrical connection member of the harness/bus type which enables all configurations that may be taken up by the various components that are connected by the electrical connection member to be monitored and tested automatically, and preferably with the help of computer means, with the various situations of the components or possibly damage thereto being simulated.

To achieve this object, electrical test apparatus for electrically testing an electrical connection member constituted by a main line and $n$ branch lines connected to the main line by couplers, is characterized in that it comprises:

$m$ branch line state circuits ($m \geq n$), each state circuit having an input connected to a branch line, switch means for connecting said input to one of two pairs of outputs or to at least one internal component in said circuit, and control means for controlling said switch means;

a controllable electrical signal generator;

a first switching assembly comprising an input connected to said signal generator, $m$ pairs of switching output terminals, each pair of switching output terminals being electrically connected to the first pair of output terminals of a respective one of said branch line state circuits, and control means for selectively connecting said input to one of said pairs of switching output terminals of the first switching assembly;

an electrical signal measuring apparatus;

a second switching assembly having an output connected to said measuring apparatus, $m$ pairs of switching input terminals, each pair of input terminals being electrically connected to the second output pair of a respective one of the branch line state circuits, and control means for selectively connecting said output to one of said pairs of switching input terminals of said second switching assembly; and a control unit for controlling said control means of the branch line state circuits and of said first and second switching assemblies, and for controlling the generation of an electrical signal by said signal generator as a function of a program of tests to be applied to said electrical connection member.

It will be understood that according to the invention, the various test states of the components interconnected by the harness/bus are simulated by two switching stages. There is the first stage where each branch line is connected to a "branch line state" circuit referred to subsequently as a "subscriber" card which serves to simulate the component that is notionally connected to said branch behaving as a sender or as a receiver, or as neither one nor the other, or that it suffers from a fault such as a short circuit or an open circuit.

The second stage is constituted by the two switching assemblies which enable each "subscriber" card to be selectively connected either to the electrical signal generator via the first switching assembly, or else to the electrical signal measuring apparatus via the second switching assembly, it naturally being possible to set up both links simultaneously.

By controlling the "positions" of the switching assemblies and the connections set up by the "subscriber" cards, it is possible to cause each of the components interconnected by the set of electrical lines successively to take up the various states that need to be taken into consideration in the test.

In a preferred embodiment, each switch assembly comprises:

two external terminals forming said input of the first switch assembly and said output of the second switch assembly;

$p$ rows of switches ($2^p \geq m$), row $i$ having $2^i$ switches, each switch having an input terminal, first and second output terminals, and controllable electrical connection means for selectively connecting said input terminal to said first output terminal or to said second output terminal, each of said first and second output terminals of switches in row $i$ being electrically connected to the input terminal of a respective switch in row i+1, the two external terminals being connected to respective input terminals of the two switches of the first row; and control means for controlling the controllable electrical connection means of all of the switches in the same row simultaneously in such a manner that for all of the switches of the same row, the input terminal is connected to the first output terminal or is connected to the second output terminal depending on binary control states;

each of the $2^p$ first output terminals and each of the $2^p$ second output terminals being connected to a respective one of the switching input or output terminals, and the first and second output terminals of the ith row being connected to the input terminals of the switches of the (i+1)th row in such a manner that for each combination of binary control states of the control means of the rows of switches, the two external terminals of said switching assembly can be connected to any one single pair of switching input or output terminals.

It will be understood that the switching assembly is constituted by a binary tree structure of sets of switches organized in rows. The states of the switches belonging to a given row are changed simultaneously and the ON state for each switch line enables the terminals external to the switching assembly to be electrically connected to a single pair of switching outlet or inlet terminals, said pairs of terminals themselves being connected to the branch line state circuits, i.e. to the "subscriber" cards. This tree configuration serves to simplify control of the switching assembly while enabling the external inlet and outlet terminals to be connected in a unique manner to the switching outlet or inlet terminals which are themselves connected to the "subscriber" cards. This disposition also serves to shorten line length.

Other characteristics and advantages of the present invention appear more clearly on reading the following description of a preferred embodiment of the invention, given by way of non-limiting example. The description refers to the accompanying figures, in which.

Figure 1:
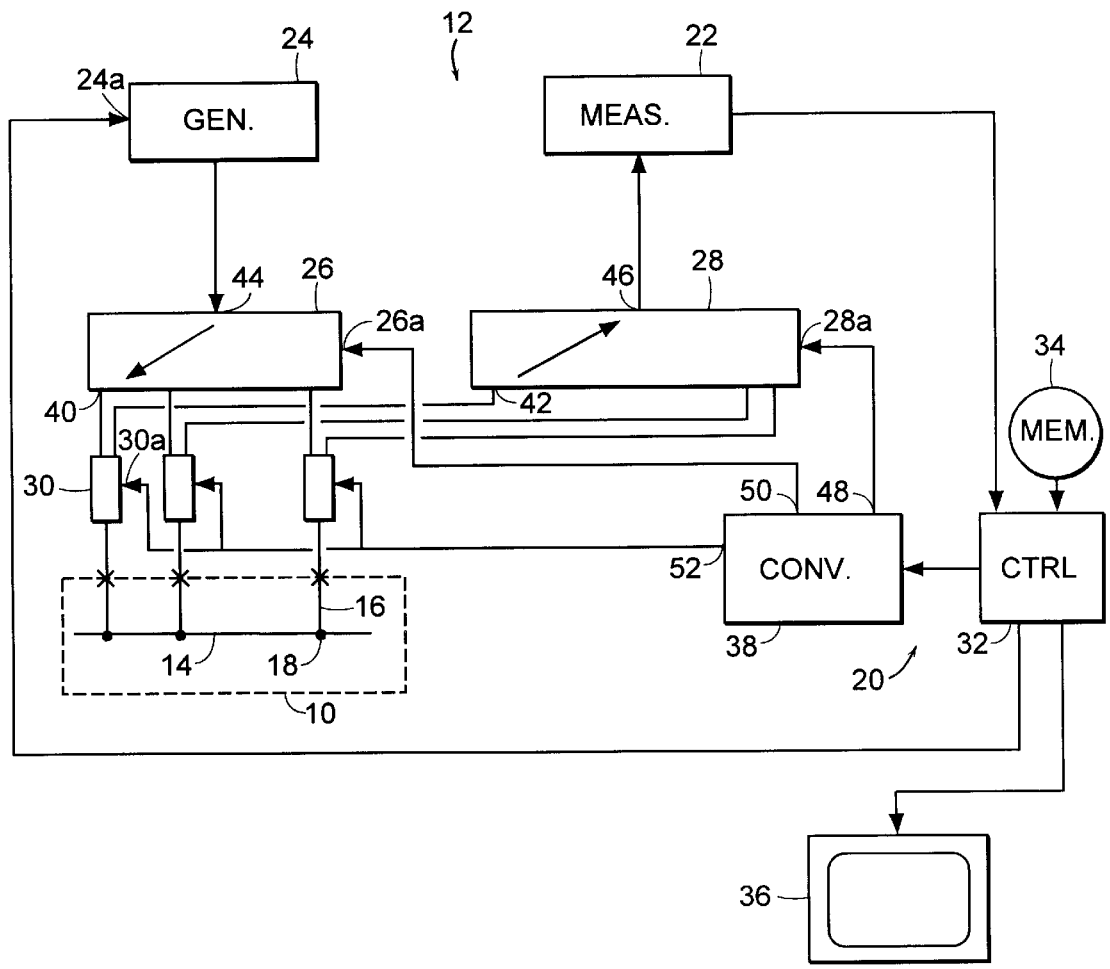
FIG. 1 is a block diagram of the electrical test apparatus a whole.

The electrical test apparatus is initially described as a whole with reference to FIG. 1.

In FIG. 1, a bus 10 to be tested is shown connected to the test apparatus 12. The bus 10 is constituted by a main line 14 having $n$ branch lines 16 connected thereto. Each branch line 16 is connected to the main line 14 by an electrical coupler 18.

The electrical test apparatus is essentially constituted by a control unit 20 for applying and controlling the battery of tests to which the bus 10 is to be subjected, an electrical measuring device 22 such as an oscilloscope or a recorder, a controllable electrical signal generator 24, first and second electrical switches respectively referenced 26 and 28, and $m$ branch line state circuits given overall reference 30 and referred to below for simplification purposes as "subscriber" cards.

The control unit 20 essentially comprises a computer apparatus 32 associated with a program memory 34 which enables the various configurations of tests to be applied to the bus 10 to be run. The computer apparatus 32 is preferably associated with means 36 for display purposes and for printing results. The computer apparatus 32 is also coupled to a converter 38 which serves to convert the instructions issued by the computer apparatus 32 into executable control signals enabling the states of the various components of the test apparatus 12 to be controlled. The computer apparatus 32 is also connected to the control input 24a of the electrical signal generator 24 in order to define the form of the electrical signal which is to be applied for the test stage under consideration.

More precisely, as shown in FIG. 1, each branch line 16 of the bus 10 is connected to the input and/or the output of a "subscriber" card 30. Each "subscriber" card 30 is connected to an output 40 of the first switch 26 and to an input 42 of the second switch 28. The input 44 of the switch 26 is connected to the output of the electrical signal generator 24, while the output 46 of the second switch 28 is connected to the input of the electrical measuring apparatus 22. The converter 38 has a first output 48 which is connected to the control input 28a of the switch 28 and a second control output 50 which is connected to the control input 26a of the first switch 26.

As explained in greater detail below with reference to FIGS. 2 and 3, the switch 26 enables its input 44 to be connected to one of the outputs 40 of said switch and thus to one of the $m$ "subscriber" cards 30. Similarly, the switch 28 serves to connect one of its inputs 42, i.e. one of the "subscriber" cards 30, to its own output 46, i.e. to the measuring device 22. The conversion apparatus 38 includes a third control output 52 which is applied to the control input 30a of each of the "subscriber" cards 30. The converter can use its output 52 to apply a control signal to each "subscriber" card serving, as explained in greater detail below, to define the state of each of the branch lines 16 during a test stage. Depending on which control signal is applied to the inputs 30a of the "subscriber" cards 30. Each subscriber card can connect the branch line with which it is associated to the electrical signal generator 24 or to the measuring device 22, or to neither of them. Under such circumstances, the control signal can put the "subscriber" card in a state that corresponds to short circuiting the corresponding branch line 16 or that represents the nominal operating load applied thereto.

The way in which the electrical test apparatus 12 operates is described below. For each step in a series of tests, one branch line sends, one branch line receives, and the other branch lines are either short circuited to simulate a breakdown, or open circuit, or else connected to their normal loads. Implementing the test step thus consists in the program 34 defining the number of the sending branch line 16, the number of the receiving branch line 16, and the state of each of the other branch lines. It is also necessary to define data specifying the characteristics of the signal that is to be sent by the sending branch line and possibly also the nature of the measurements to be performed.

These various items of information are transmitted to the converter 38 which serves firstly to control the various "subscriber" cards 30 as a function of the state of the branch line associated therewith. More precisely, one of the "subscriber" cards is controlled to connect the branch line to the electrical signal generator 24 and another card is controlled to connect the "subscriber" card to the measuring device 22. The other "subscriber" cards are controlled to take up respective ones of the other possible states. Simultaneously, the converter 38 controls the switches 26 and 28 so that the sending "subscriber" card is indeed connected to the generator 24 and so that the receiving "subscriber" card is indeed connected to the measuring device 22. In addition, the electrical signal generator 24 is controlled to apply the desired form of electrical signal for the test. Once these various connections have been set up, the measuring device 22 performs the measurements of electrical characteristics as specified in the test, which measurements are transmitted to the computer apparatus 32 which enables them to be processed and possibly displayed on the display apparatus 36 or on a paper medium, or else to be stored on a computer medium.

It will be understood that the general organization of the test apparatus makes it possible in a relatively short length of time to cause each of the branch lines to act as a sender in combination successively with each of the other branch lines then acting as a receiver, and while combining these various states with the various configurations possible for the other branch lines that are acting neither as a sender nor as a receiver. Changeover from one configuration to another is controlled automatically by the computer program implemented by the computer apparatus 32 whose instructions are converted into electrical control signals by the converter 38.

Figure 2:
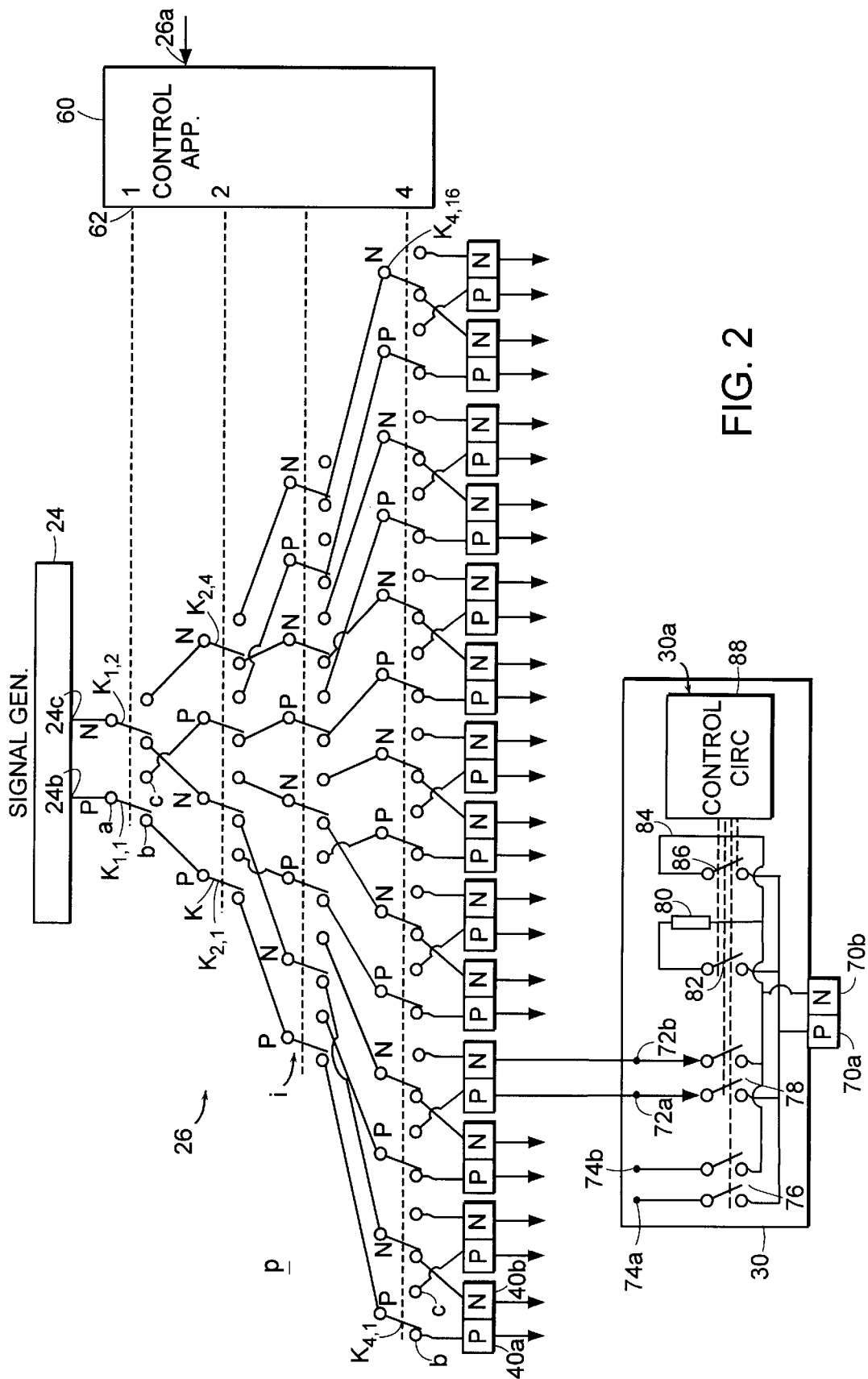
FIG. 2 is a diagram showing the switching assembly in send mode together with a "subscriber" card.

With reference now to FIG. 2, there follows a description of a preferred embodiment of the first switch 26 enabling the "subscriber" cards to be connected to the electrical signal generator 24, and also a preferred embodiment of a "subscriber" card 30.

The switch 26 is essentially constituted by $p$ lines of unit switches given generic reference K. The first row of switches comprises two unit switches $K_{1,1}$ and $K_{1,2}$ whose inputs are given generic reference $a$ and are connected to respective output terminals 24b & 24c of the generator 24. Generically, each switch $K_{i,j}$ has two output terminals respectively referenced $b$ and $c$. The second row of the switch has four unit switches carrying references $K_{2,1}$ to $K_{2,4}$. Each first output terminal $b$ of a switch in row $i$ is connected to the input terminal $a$ of a switch in row i+1, and each output terminal $c$ of a switch in row $i$ is connected to the input $a$ of another switch in row i+1. A tree structure of switches is thus obtained, with each row $i$ containing twice as many switches as row i−1. More generally, row $i$ of unit switches $K_{i,j}$ has $2^i$ switches. In the example under consideration, the switch assembly has four rows of unit switches, which means that the fourth row has $2^4$ unit switches referenced $K_{4,1}$ to $K_{4,16}$. The outputs $b$ and $c$ of the unit switches K in the last row are connected respectively to the positive external output terminals 40a of the switch assembly and to the negative terminals 40b of the switch assembly.

As also shown in FIG. 2, the switch includes a control unit 60 having as many control outputs 62 as there are rows of unit switches, i.e. four in the example under consideration. Each output 62 from the control apparatus 60 serves to connect the $a$ inputs of the unit switches in a given row simultaneously to the $b$ output terminals or simultaneously to the $c$ output terminals. A complete control instruction for the switch 26 thus comprises four binary digits indicating whether the switches of a corresponding row $i$ are to be in a position that connects the $a$ inputs to the $b$ terminals or in a position which connects the $a$ inputs to the $c$ terminals.

The electrical links between the output terminals $b$ and $c$ of the unit switches $K_i$ in row $i$ and the terminals $a$ of the switches $K_{i+1}$ row i+1 are such that the outputs 24b & 24c of the electrical generator 24 can be connected to any one of the pairs of external output terminals 40a & 40b of the switch 20, and to only one such pair. FIG. 2 shows one possible configuration for the electrical connections.

In other words, when a control signal is applied to the input 26a of the control apparatus 60 of the switch 26, the switches in the various rows take up respective states enabling the generator 24 to be connected to a selected pair of external output terminals 40a & 40b, i.e. enabling the generator 24 to be connected to a determined "subscriber" card 30.

Still with reference to FIG. 2, a preferred embodiment of a "subscriber" card 30 is described. It has a first input/output pair constituted by a positive terminal 70a and a negative terminal 70b. As already mentioned, the terminals 70a & 70b are connected to a branch line 16 of the bus 10 to be tested. The "subscriber" card includes a second pair of external connection terminals 72a & 72b for connection to a pair of external output terminals 40a & 40b of the switch 26. The card 30 also has a third pair of external terminals 74a & 74b for connection to the external input terminals of the switch 28, as explained below. Double-pole switches 76 and 78 serve to connect the terminals 70a & 70b respectively to the terminals 72a & 72b and 74a & 74b, or on the contrary to disconnect them therefrom. The terminals 70a & 70b can also be connected to a load 80 simulating the normal load which is to be applied to the branch line in non-sending and non-receiving operation, which connection can be established by a switch 82, or else it can simulate a short circuit which can be via conductor line 84 and a switch 86. The "subscriber" card also includes a control circuit 88 which enables the open or closed positions of the switches 76, 78, 82, and 86 to be controlled individually depending on the state in which the branch line associated with the "subscriber" card is to be placed. In other words, the control circuit 88 receives a series of instructions via the control input of the card 30a to cause one of its switches to be closed while the other three remain open.

The unit double-pole switches K can be of any kind. Similarly, the means for controlling the moving contacts of the switches, which means are merely symbolized in FIGS. 2 and 3 by dashed lines, may be of any kind. It is possible, in particular, to use relays whose states are controlled via opto-couplers.

Figure 3:
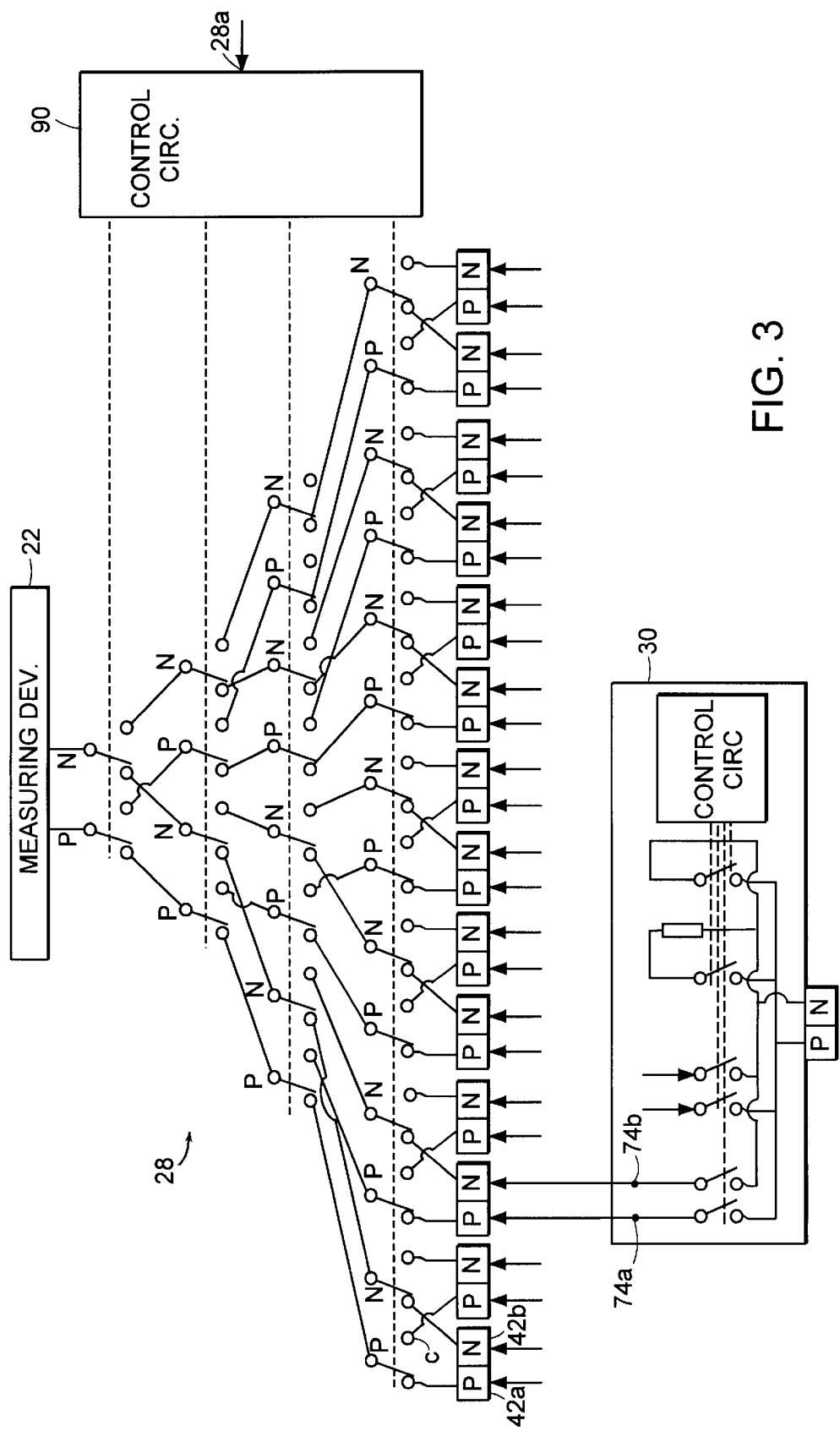
FIG. 3 is a view similar to FIG. 2, but showing the switching assembly in receive mode.

FIG. 3 shows a preferred embodiment of the switch 28. This has exactly the same architecture as the switch 26. It should merely be understood that where there used to be external output terminals there are now external input terminals 42a & 42b of the switch for connecting each "subscriber" card 30 to the electrical measuring device 22. More precisely, as shown in FIG. 3, the terminals 74a & 74b of each "subscriber" card 30 are connected to external input terminals 42a & 42b of the switch 28. The switch is controlled in rows by its control circuit 90 which receives instructions on an input 28a.

The tree structure of the switches 26 and 28 presents numerous advantages. Firstly, switch control is simplified since it suffices to provide $p$ binary digits to switch the external terminals connected to the signal generator or to the measuring device through to a selected one of the $2^p$ pairs of terminals connected to the "subscriber" cards. Also, each electrical path defined between the input pair of terminals and any one of the output terminals includes the same number of intermediate contacts, thereby ensuring the same qualities of electrical conduction for all of the paths, and the path lengths are also all substantially equal. In addition, for each control state applied to the unit switches, they define only two electrical paths which go from the input terminals to a pair of output terminals, and there are no partial paths as seen from the input terminals, thereby avoiding interference phenomena that might be induced by partial paths connected to the input terminals.

I claim:

1. Electrical test apparatus for electrically testing an electrical connection member constituted by a main line and n branch lines connected to the main line by couplers, the apparatus comprising:

$\underline{m}$ branch line state circuits ($m \geq n$), each state circuit having a branch line input/output connected to a branch line, switch means for connecting said branch line input/output to one of a pair of inputs and a pair of outputs of said state circuit or to at least one internal component in said circuit, and first control means for controlling said switch means;

a controllable electrical signal generator;

a first switching assembly including an input connected to said signal generator, $\underline{m}$ pairs of switching output terminals, each pair of switching output terminals being electrically connected to the pair of inputs of a respective one of said branch line state circuits, and second control means for selectively connecting said input of said first switching assembly to one of said pairs of switching output terminals of the first switching assembly;

an electrical signal measuring apparatus;

a second switching assembly having an output connected to said measuring apparatus, $\underline{m}$ pairs of switching input terminals, each pair of switching input terminals being electrically connected to the pair of outputs of a respective one of the branch line state circuits, and third control means for selectively connecting said output of said second switching assembly to one of said pairs of switching input terminals of said second switching assembly; and a control unit for controlling said first, second and third control means of the branch line state circuits and of said first and second switching assemblies, and for controlling the generation of an electrical signal by said signal generator as a function of a program of tests to be applied to said electrical connection member.

2. Electrical test apparatus according to claim 1, wherein each switching assembly includes:

two external terminals forming said input of the first switch assembly and said output of the second switch assembly;

$\underline{p}$ rows of switches ($2^p \geq m$), row $\underline{i}$ having $2^p$ switches, each switch having an input terminal, first and second output terminals, and controllable electrical connection means for selectively connecting said input terminal to said first output terminal or to said second output terminal, each of said first and second output terminals of switches in row $\underline{i}$ being electrically connected to the input terminal of a respective switch in row i+1, the two external terminals being connected to respective input terminals of the two switches of the first row; and control means for controlling the controllable electrical connection means of all of the switches in the same row simultaneously in such a manner that for all of the switches of the same row, the input terminal is connected to the first output terminal or is connected to the second output terminal depending on binary control states;

each of the $2^p$ first output terminals and each of the $2^p$ second output terminals being connected to a respective one of the switching input or output terminals, and the first and second output terminals of the ith row being connected to the input terminals of the switches of the (i+1)th row in such a manner that for each combination of binary control states of the control means of the rows of switches, the two external terminals of said switching assembly is connected to any one single pair of switching input or output terminals.

3. Electrical test apparatus according to claim 1 or 2, characterized in that each branch line state circuit includes first switch means for directly connecting said branch line input/output to one or the other of the pair of inputs and the pair of outputs or to omit such connection, second switch means for connecting one of said pair of inputs and said pair of outputs to an electrical load, third switch means for short circuiting one of the pair of inputs and the pair of outputs, and separate control means for controlling the positions of said first, second, and third switch means.

* * * * *

UNITED STATES PATENT AND TRADEMARK OFFICE
CERTIFICATE OF CORRECTION

PATENT NO. : 5,811,977
DATED : September 22, 1998
INVENTOR(S): Rouchaud

It is certified that error appears in the above-identified patent and that said Letters Patent is hereby corrected as shown below:

On the title page:

In the heading, please change "Rouchard" to --Rouchaud--.

In the designation of Inventor [75], change "Rouchard" to --Rouchaud--.

Signed and Sealed this

Fourteenth Day of December, 1999

Attest:

Q. TODD DICKINSON

*Attesting Officer*   *Acting Commissioner of Patents and Trademarks*